United States Patent [19]
Wen et al.

[11] Patent Number: 5,825,069
[45] Date of Patent: Oct. 20, 1998

[54] HIGH-DENSITY SEMICONDUCTOR READ-ONLY MEMORY DEVICE

[75] Inventors: Jemmy Wen; Jih-Wen Chou, both of Hsinchu, Taiwan

[73] Assignee: United Microeltronics Corp., Hsinchu, Taiwan

[21] Appl. No.: 851,545

[22] Filed: May 5, 1997

[30] Foreign Application Priority Data

Jan. 27, 1997 [TW] Taiwan ................................. 86100883

[51] Int. Cl.$^6$ .............................................. H01L 21/8246
[52] U.S. Cl. .......................... 257/390; 257/391; 257/910
[58] Field of Search ................................... 438/275–283, 438/128–129; 257/390–391, 910

[56] References Cited

U.S. PATENT DOCUMENTS 5,504,025 4/1996 Fong-Chun et al. .
5,633,519 5/1997 Yamazaki et al. .

*Primary Examiner*—Jey Tsai
*Attorney, Agent, or Firm*—Finnegan, Henderson, Farabow, Garrett & Dunner, L.L.P.

[57] ABSTRACT

A ROM device of the type including an array of diode-type memory cells and a method for fabricating the same are provided. The bit lines of this ROM device are a plurality of diffusion regions formed in an alternate manner on the bottom of a plurality of parallel-spaced trenches and on the top of the solid portions between these trenches. This particular arrangement of the bit lines allows for an increased integration of the diode-type memory cells on a limited wafer surface without having to reduce the feature size of the semiconductor components of the ROM device. The diode-type memory cells that are set to a permanently-ON state involve a P-N junction diode being formed therein, wherein the P-N junction diode is electrically connected via a contact window in an insulating layer to the associated one of the overlaying word lines. Other memory cells that are set to a permanently-OFF state are formed with no P-N junction diode therein.

11 Claims, 5 Drawing Sheets

HIGH-DENSITY SEMICONDUCTOR READ-ONLY MEMORY DEVICE

BACKGROUND OF THE INVENTION

1. Field of the Invention

This invention relates to semiconductor memory devices, and more particularly, to a semiconductor read-only memory (ROM) device of the type including a plurality of diode-type memory cells and a method for fabricating the same. It is a distinctive feature of this invention that the bit lines for the ROM device are formed in an alternate manner on the bottom of a plurality of substantially parallel-spaced trenches and on the top of the solid portions between these trenches such that the packing density of the memory cells on the ROM device can be increased.

2. Description of Related Art

Read-only memory (ROM) is a nonvolatile semiconductor memory widely used in computer and microprocessor systems for permanently storing information including programs and data that are repeatedly used, such as the BIOS (abbreviation for Basic Input/Output System, a widely used operating system on personal computers) or the like. The manufacture of ROMs involves very complicated and time-consuming processes and requires costly equipment and material to achieve. Therefore, the information to be stored in ROMs is usually first defined by the customer and then furnished to the factory to be programmed into the ROMs.

The feature size of ROMs is dependent on the semiconductor fabrication technology. Conventional ROMs are formed by an array of MOSFETs (metal-oxide semiconductor field-effect transistor), each MOSFET being associated with one single memory cell of the ROM device. The binary data stored in each of these MOSFET-based memory cell is dependent on a particular electrical characteristic thereof, such as the threshold voltage.

If the channel of a MOSFET memory cell is doped with a high concentration of an impurity material, this MOSFET will be set to a low threshold voltage that is less than the gate voltage, effectively setting this MOSFET memory cell to a permanently-ON state representing the permanent storage of a first binary digit, for example 0.

On the other hand, if the channel of a MOSFET memory cell is not doped with impurities, the MOSFET memory cell will have a high threshold voltage that is greater than the gate voltage, thus effectively setting the MOSFET memory cell to a permanently-OFF state representing the permanent storage of a second binary digit, for example 1. This type of ROM device will be described in more detail in the following with reference to FIGS. 1A through 1C.

Referring to FIG. 1A, there is shown a schematic top view of a conventional ROM device. This ROM device is formed with a plurality of substantially parallel-spaced diffusion regions which serve as a plurality of buried bit lines 12a, 12b, 12c beneath a plurality of field oxide layers 200. Further, a plurality of word lines (WL1, WL2) 18, 18' are formed in such a manner as to intercross the bit lines 12a, 12b, 12c at a right angle. The intersections between the bit lines 12a, 12b, 12c and the word lines WL1, WL2 are the locations where the memory cells of the ROM device are formed. For instance, a first memory cell 16a is formed on the word line WL2 between the bit lines 12a, 12b; a second memory cell 16b is formed on the word line WL2 between the bit lines 12b, 12c; a third memory cell 16c is formed on the word line WL1 between the bit lines 12a, 12b; and a fourth memory cell 16d is formed on the word line WL1 between the bit lines 12b, 12c. The binary data that are permanently stored in these memory cells 16a, 16b, 16c, 16d are dependent on the concentration of the associated diffusion regions. For instance, the $N^+$ regions in FIG. 1A represent that the associated memory cells 16a, 16d are set to a permanently-ON state; while the memory cells 16b, 16c are set to a permanently-OFF state.

FIG. 1B is a perspective view of a cutaway part of the ROM device of FIG. 1A, with the front side thereof showing a cross-sectional view cutting through the line II—II in FIG. 1A This perspective diagrams shows that the ROM device includes a P-type silicon substrate 10 on which the bit lines 12a, 12b, 12c and the overlaying field oxide layers 200 are formed. Beside these, the ROM device includes a thin insulating layer 14 on which the word lines (WL1, WL2) 18, 18' are formed.

FIG. 1C is an equivalent circuit diagram of the ROM device of FIG. 1A. This circuit diagram shows that the two word lines WL1 and WL2 are used to access the binary data stored in the four memory cells 16a, 16b, 16c, 16d via the three bit lines (BL1, BL2, BL3) 12a, 12b, 12c. In this example, the first memory cell 16a is set to a permanently-ON state; the second memory cell 16b is set to a permanently-OFF state; the third memory cell 16c is set to a permanently-OFF state; and the fourth memory cell 16d is set to a permanently-ON state.

One drawback to the foregoing ROM device is that the MOSFET-based memory cells are comparatively large in size and thus require a large space in the wafer to construct. When the feature size of these MOSFET-based memory cells is further reduced, the so-called short-channel effect will occur, causing a leakage current in the ROM device. Moreover, the operating voltage of the foregoing ROM device is restricted by the threshold voltage of the MOSFET-based memory cells. If the operating voltage is low, the current in the bit lines will be also low, causing the sense amplifiers difficulty in distinguishing whether the accessed data is 0 or 1.

SUMMARY OF THE INVENTION

It is therefore a primary objective of the present invention to provide a ROM device which allows for an increased integration of memory cells on a limited wafer surface without having to reduce the feature size of the semiconductor components thereof.

It is another objective of the present invention to provide a ROM device which can be operated at a low voltage.

It is still another objective of the present invention to provide a method for fabricating the foregoing ROM device.

In accordance with the foregoing and other objectives of the present invention, an improved ROM device and a method for fabricating the same are provided. The ROM device is of the type including an array of diode-type memory cells.

The semiconductor structure of the ROM device includes:

a semiconductor substrate of a first semiconductor type formed with a plurality of substantially parallel-spaced trenches oriented in a first direction;

a plurality of substantially parallel-spaced diffusion regions of a second semiconductor type formed in an alternate manner on the bottom of the trenches and on the top of the solid portions between the trenches, the diffusion regions serving as a plurality of bit lines;

a plurality of doped regions of the first semiconductor type formed in a selected number of locations on the diffusion regions that are associated with a first group of the memory cells of the ROM device that are set to a permanently-ON state;

an insulating layer formed over those locations on the diffusion regions that are associated with a second group of the memory cells of the ROM device that are set to a permanently-OFF state; and a plurality of substantially parallel-spaced conductive layers serving as a plurality of word lines oriented in a second direction to intercross the bit lines, the word lines coming into electrical contact with all of the doped regions formed in the bit lines associated with the first group of memory cells.

Further, the method for fabricating the foregoing ROM device includes the following steps of:

(1) preparing a semiconductor substrate of a first semiconductor type;

(2) forming a plurality of substantially parallel-spaced trenches in the substrate in a first direction;

(3) performing a first ion-implantation process to diffuse a first impurity material of a second semiconductor type into the substrate to form a plurality of substantially parallel-spaced diffusion regions in an alternate manner on the bottom of the trenches and on the top of the solid portions between the trenches, the diffusion regions serving as a plurality of bit lines;

(4) forming an insulating layer over the bit lines, the insulating layer being selectively removed to expose a selected number of locations on the diffusion regions where the second group of memory cells that are to be set to a permanently-OFF state are formed;

(5) by using the insulating layer as a mask, performing a second ion-implantation process so as to diffuse a second impurity material of the first semiconductor type into the exposed portions of the bit lines to thereby form a plurality of doped regions of the first semiconductor type in the exposed portions of the bit lines; and (6) forming a plurality of substantially parallel-spaced conductive layers oriented in a second direction, the conductive layers serving as word lines intercrossing the bit lines and coming into electrical contact with the doped regions formed in the first group of memory cells.

It is a distinctive feature of the invention that the bit lines of the ROM device are arranged in an alternate manner on the bottom of a plurality of parallel-spaced trenches and on the top of the solid portions between these trenches. This feature allows for an increased integration of the diode-type memory cells on a limited wafer surface without having to reduce the feature size of the semiconductor components of the ROM device.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

Figure 1A:
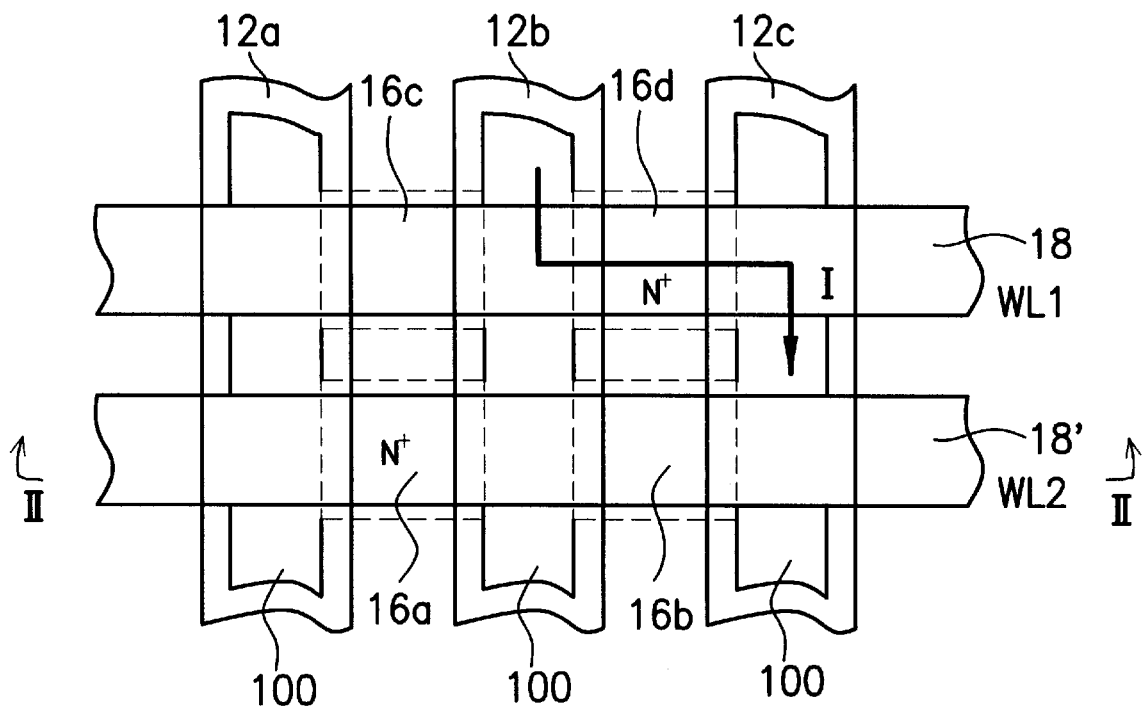
FIG. 1A is a schematic top view of a conventional ROM device.
Figure 1B:
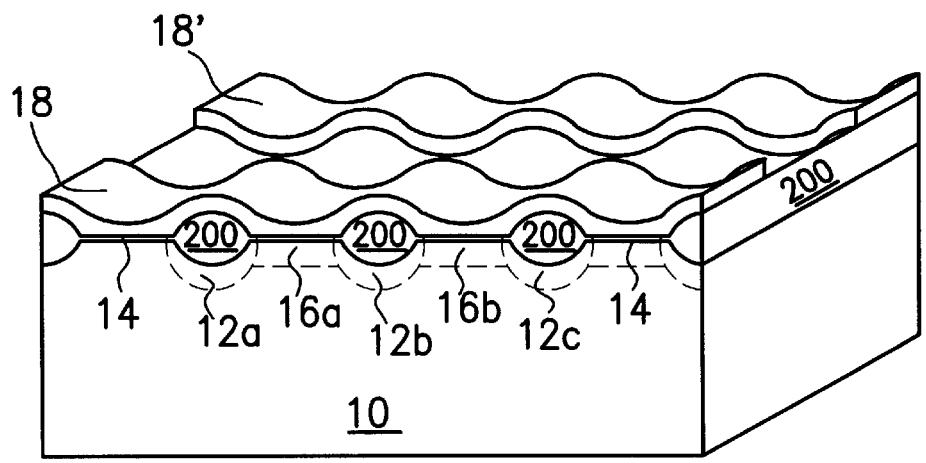
FIG. 1B is a schematic perspective view of a cutaway part of the ROM device of FIG. 1A cutting through the line II—II in FIG. 1A.
Figure 1C:
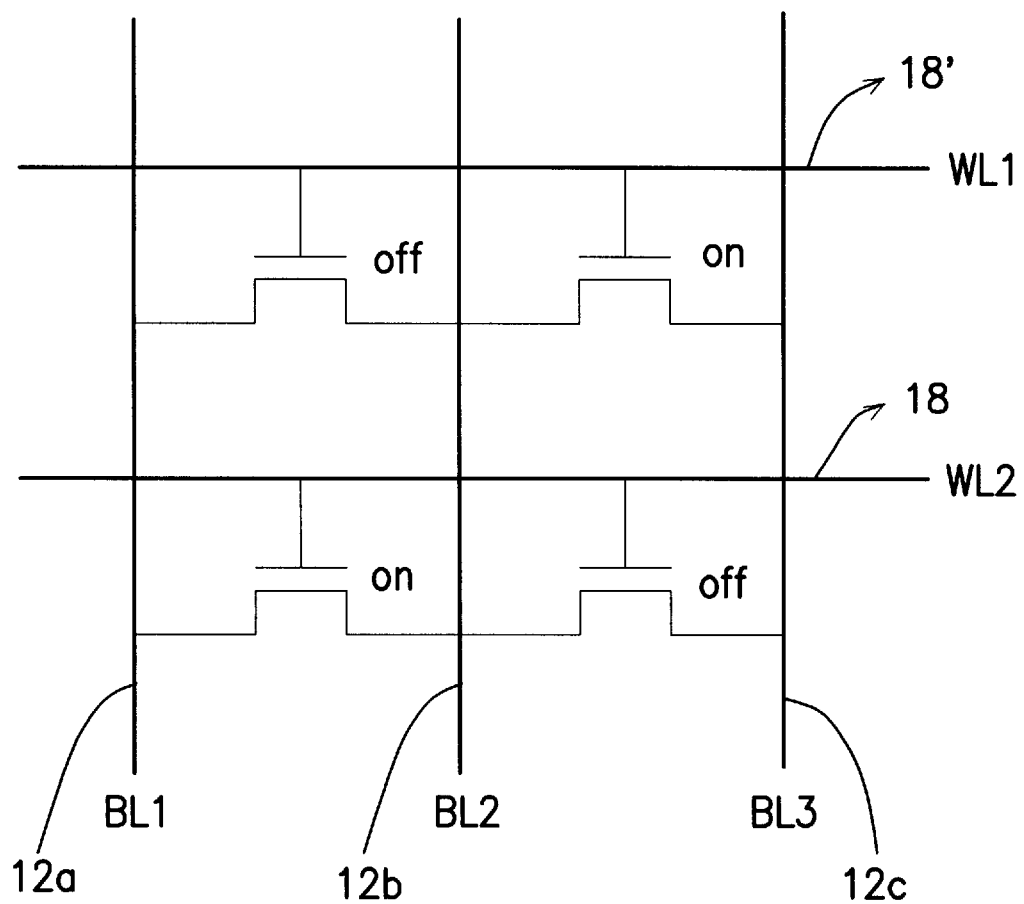
FIG. 1C is an equivalent circuit diagram of the ROM device of FIG. 1A.
Figure 2A:
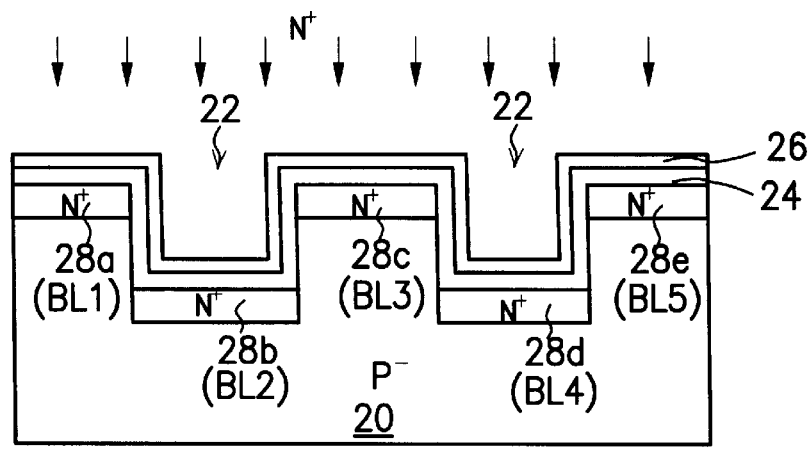
FIGS. 2A through 2C are schematic sectional diagrams of wafer structures which are used to depict the steps involved in the method of the invention for fabricating a ROM device.
Figure 2B:
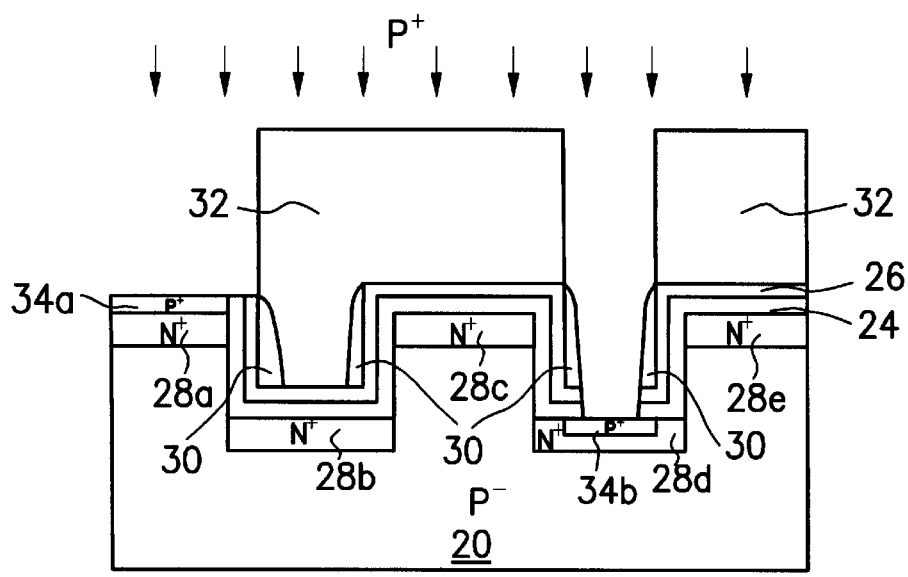
Figure 2C:
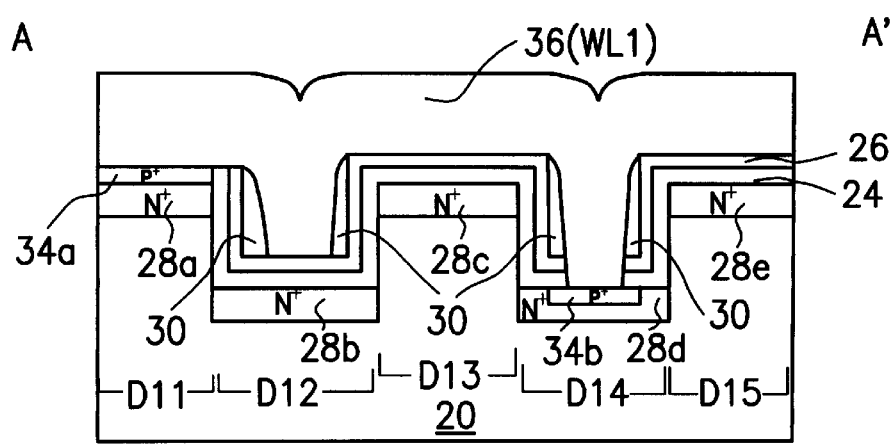

FIGS. 2A through 2C are schematic sectional diagrams of wafer structures which are used to depict the steps involved in the method of the invention for fabricating a ROM device.

Referring first to FIG. 2A, in the first step, a semiconductor substrate 20 of a first semiconductor type, such as a P-type silicon substrate, is prepared. This substrate 20 is selectively removed to form a plurality of substantially parallel-spaced trenches 22 (which are shown in perpendicular to the drawing sheet of FIG. 2A) therein. Subsequently, a pad oxide layer 24 and an insulating layer 26, such as a layer of silicon nitride, are successively formed over the wafer, each being deposited to an even thickness both over the topmost surface of the substrate 20 and on the sidewalls and bottom surfaces of the trenches 22. An ion-implantation process is then performed on the wafer so as to diffuse an impurity material of a second semiconductor type, such arsenic or phosphor, through the silicon nitride insulating layer 26 and pad oxide layer 24 into the underlying portions of the substrate 20. This forms a plurality of substantially parallel-spaced buried $N^+$ diffusion regions 28a, 28b, 28c, 28d, 28e which are arranged in an alternate manner on the bottom of the trenches 22 and on the top of the solid portions between the trenches 22. These $N^+$ diffusion regions 28a, 28b, 28c, 28d, 28e serve as a plurality of bit lines, as designated respectively by BL1, BL2, BL3, BL4, and BL5, for the ROM device. As shown, the bit lines [BL1, BL3, BL5], i.e., the $N^+$ diffusion regions 28a, 28c, 28e, are formed on the top of the solid portions between the trenches 22, while the bit lines [BL2, BL4], i.e., the $N^+$ diffusion regions 28b, 28d are formed on the bottom of the trenches 22.

Referring next to FIG. 2B, in the subsequent step, sidewall spacers 30 are formed on the sidewalls of the trenches 22. These sidewall spacers 30 can be formed by first forming an insulating layer, such as a layer of silicon dioxide, over the silicon-nitride insulating layer 26 and then performing an etch-back process on the silicon-dioxide insulating layer to remove the undesired portions thereof. Next, a photoresist layer 32 is formed over the wafer and selectively removed to expose the areas right above a selected group of the bit lines that are associated with those diode-type memory cells of the ROM device that are to be set to a permanently-ON state. The unexposed bit lines are, on the other hand, associated with those diode-type memory cells of the ROM device that are to be set to a permanently-OFF state.

In the case of FIG. 2B, for example, the bit lines BL1 and BL4 (the $N^+$ diffusion regions 28a and 28d) are associated with two memory cells of the ROM device that are to be set to a permanently-ON state, such that the overlaying areas are exposed; whereas the bit lines BL2, BL3, and BL5 (the $N^+$ diffusion regions 28b, 28c, and 28e) are associated with three memory cells of the ROM device that are to be set to a permanently-OFF state, such that the overlaying areas are unexposed.

The photoresist layer 32 is then used as a mask to conduct an etching process on the wafer so as to etch away the exposed portions of the silicon-nitride insulating layer 26 and pad oxide layer 24 until the underlying N⁺ diffusion regions 28a and 28d (the bit lines BL1, BL4) are exposed. An ion-implantation process is then performed on the wafer so as to diffuse a P-type impurity material, such as boron, boron fluoride, or boron ethane, into the exposed N⁺ diffusion regions 28a and 28d (the bit lines BL1, BL4). Through this process, a shallow-junction P⁺ doped region, as respectively designated by the reference numerals 34a, 34b, is formed in each of the exposed N⁺ diffusion regions 28a and 28d (the bit lines BL1, BL4). This forms a P-N junction diode in each of the exposed N⁺ diffusion regions 28a and 28d (the bit lines BL1, BL4), having a forward bias voltage of about 0.4 V (volt) to 0.7 V. The inverse breakdown voltage and inverse leakage current of the P-N junction diode can be controlled by adjusting the ratio of the concentration of the N-type impurity material in the N⁺ diffusion regions 28a, 28d to that of the P-type impurity material in the P⁺ doped regions 34a, 34b.

Referring further to FIG. 2C, in the subsequent step, the photoresist layer 32 is removed. Then, a plurality of substantially parallel-spaced conductive layers (which are in parallel to the drawing sheet of FIG. 2C so that only one as designated by the reference numeral 36 is visible in FIG. 2C) are formed on selected areas on the wafer by using a conductive material selected from the group consisting of polysilicon, aluminum, tungsten, and titanium. These conductive layers 36 serve as a plurality of word lines intercrossing the bit lines. Each of the conductive layers 36 fills up the intercrossed portions of the trenches 22 and comes into electrical contact with the P⁺ doped regions 34a, 34b in the N⁺ diffusion regions 28a, 28d (the bit lines BL1, BL4). In the case of FIG. 2C, five diode-type memory cells, respectively designated by the reference numerals D11, D12, D13, D14, and D15, are formed, of which the memory cells D11 and D14 are set to a permanently-ON state since they are each formed with a P⁺ doped region, i.e., the P⁺ doped regions 34a and 34b respectively; while the memory cells D12, D13, and D15 are set to a permanently-OFF state since they are formed with no P⁺ doped regions and are isolated by the pad oxide layer 24 and silicon-nitride insulating layer 26 from the overlaying conductive layers 36 (the word lines).

Figure 3A:
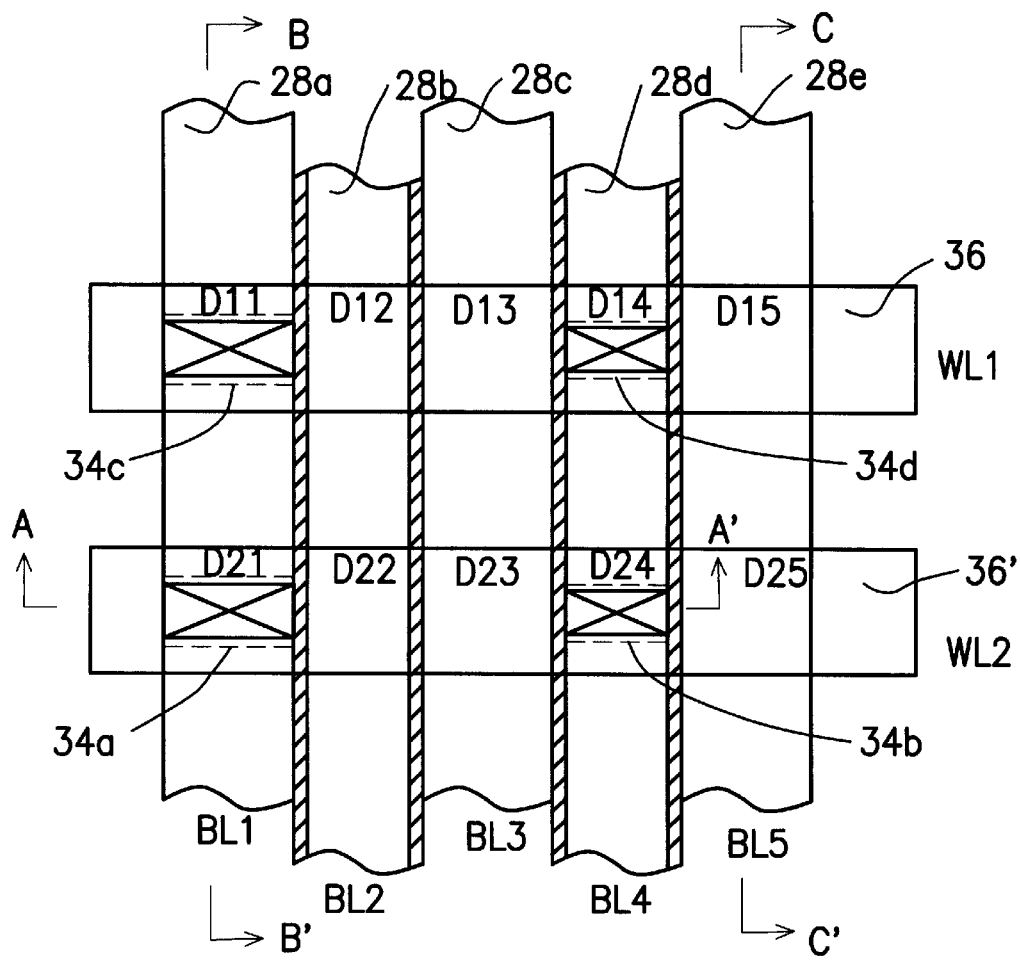
FIG. 3A is a schematic top view of the finished-product of the ROM device of FIG. 2C.
Figure 3B:
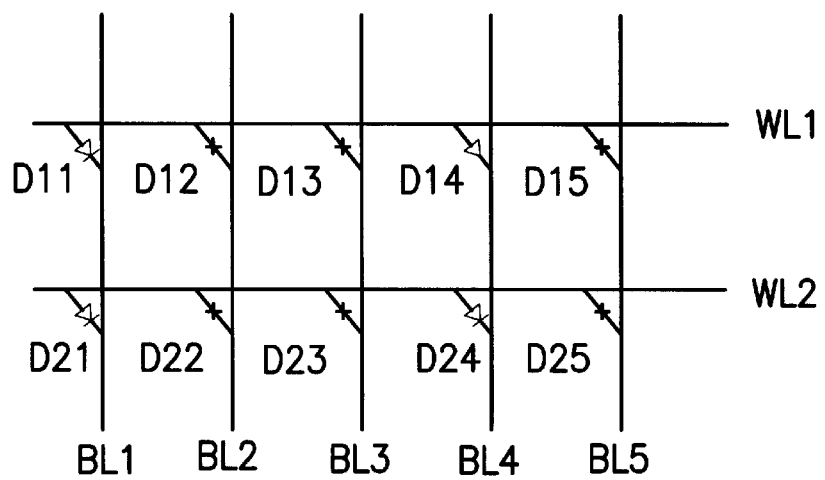
FIG. 3B is an equivalent circuit diagram of the ROM device of FIG. 3A.

FIG. 3A is a schematic top view of the finished-product of the ROM device of FIG. 2C. This diagram shows that the ROM device can be accessed via the bit lines BL1, BL2, BL3, BL4, BL5 (the N diffusion regions 28a, 28b, 28c, 28d, and 28e) and the word lines WL1, WL2 (the conductive layers 36, 36'). The intersection between each of the bit lines and each of the word lines is the location where one diode-type memory cell of the ROM device is formed. In the case of FIG. 3A, for example, five diode-type memory cells D11, D12, D13, D14, and D15 are formed on the intersections between the word line WL1 and the bit lines BL1, BL2, BL3, BL4, BL5; and another five diode-type memory cells D21, D22, D23, D24, and D25 are formed on the intersections between the word line WL2 and the bit lines BL1, BL2, BL3, BL4, BL5. Among them, for example, the memory cells D11, D14, D21, D24 are each formed with one P⁺ doped region (as designated by the crossed boxes labeled with the reference numerals 34c, 34d, 34a, 34b respectively) in the associated bit line, such that they are set to a permanently-ON state. All the other memory cells D12, D13, D15, D22, D23, D25 are formed with no P⁺ doped region therein, such that they are set to a permanently-OFF state. The equivalent circuit of the ROM device of FIG. 3A is shown in FIG. 3B.

Figure 4A:
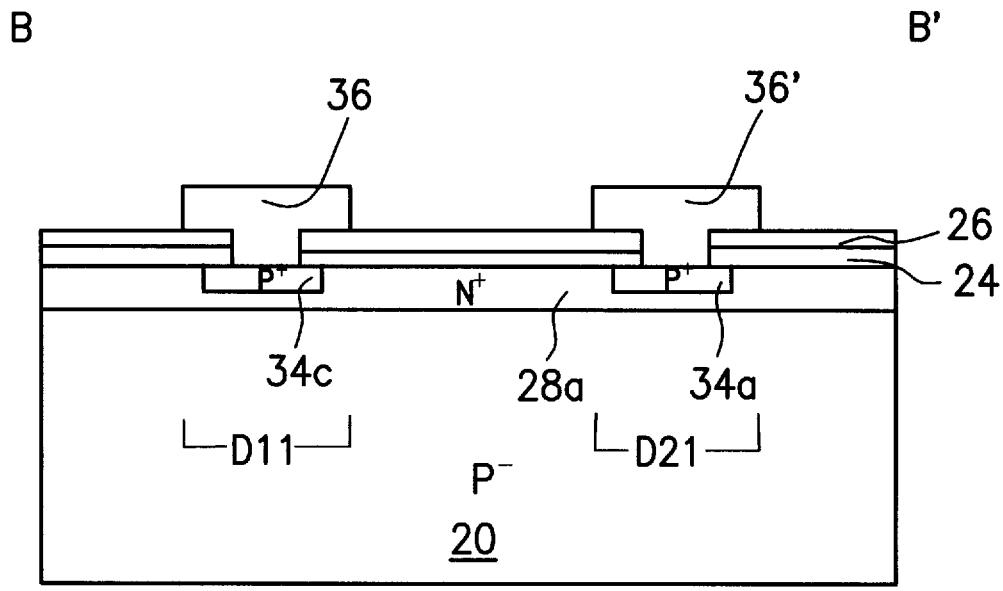
FIG. 4A is a schematic sectional diagram of the ROM device of FIG. 3A cutting through the line B—B'.
Figure 4B:
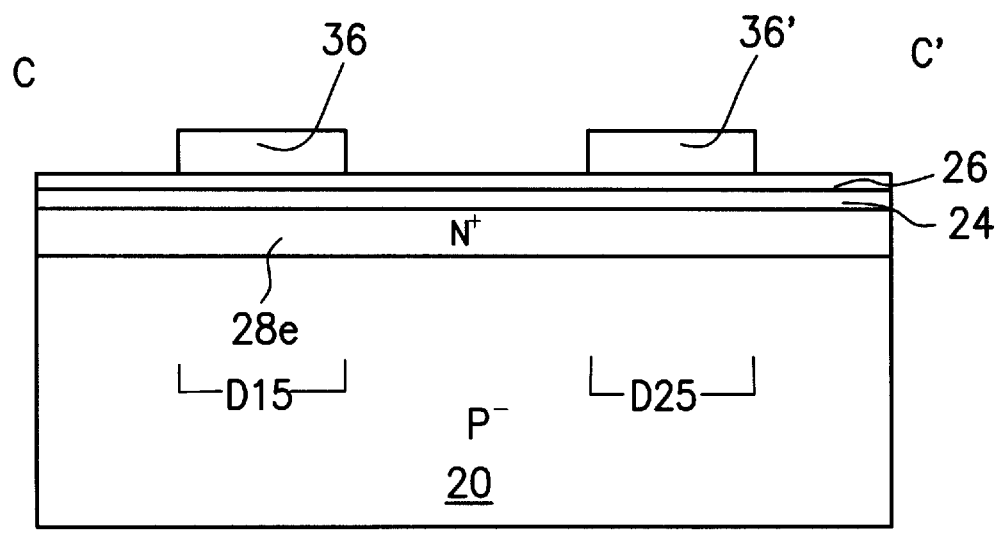
FIG. 4B is a schematic sectional diagram of the ROM device of FIG. 3A cutting through the line C—C'.

Furthermore, FIG. 4A shows a schematic sectional view of the ROM device of FIG. 3A cutting through the line B—B', while FIG. 4B shows another schematic sectional view of the same cutting through the line C—C'.

In FIG. 4A, it can be seen that the two memory cells D11, D21 that are formed at the intersections between one bit line (the N⁺ diffusion region 28a) and two word lines (the conductive layers 36, 36') are each formed with one P⁺ doped region, respectively 34c and 34a, to form one P-N junction diode in the associated bit line (N⁺ diffusion region) 28a. Further, the P⁺ doped regions 34c, 34a are respectively electrically connected to the word lines (conductive layers) 36, 36' through the respective contact windows in the pad oxide layer 24 and silicon-nitride insulating layer 26. This sets the two memory cells D11, D21 to a permanently-ON state representing the permanent storage of a first binary digit, for example 0.

In FIG. 4B, it can be seen that the two memory cells D15, D25 that are formed at the intersections between one bit line (the N⁺ diffusion region 28e) and two word lines (the conductive layers 36, 36') and are set to a permanently-OFF state are formed with no P⁺ doped regions in the associated bit line (the N⁺ diffusion region 28e) and no contact windows in the pad oxide layer 24 and silicon-nitride insulating layer 26. This sets the two memory cells D15, D25 to a permanently-OFF state representing the permanent storage of a second binary digit, for example 1.

During access operation, for example to read the data stored in the memory cell D11, a positive electrical potential (customarily referred to as an operating voltage) is applied to the associated word line WL1 while the associated bit line BL1 is connected to ground, which cause a current to flow from the word line WL1 through the P-N junction diode in the memory cell D11 to the bit line BL1. The appearance of this current indicates that the memory cell D11 is set to a permanently-ON state representing the permanent storage of a first binary digit, for example 0.

Similarly, to read data from the memory cell D25, a positive operating voltage is applied to the associated word line WL2 while the associated bit line BL5 is connected to ground. Since in the memory cell D25, the bit line BL5 is isolated by the pad oxide layer 24 and silicon-nitride insulating layer 26 from the word line WL2, no current will flow in the bit line BL2 owing to the positive operating voltage on the word line WL2, which indicates that the memory cell D25 is set to a permanently-OFF state representing the permanent storage of a second binary digit, for example 1.

In the foregoing ROM device of the invention, the positive voltage applied to the word lines can be greater than 0.7 V. During access operation, this voltage is applied to the word lines while the associated bit lines are grounded. For each of the diode-type memory cells in the ROM device that are set to a permanently-ON state, the forward bias voltage of the P-N junction diode is about in the range from 0.4 V to 0.7 V. Currents will flow through these P-N junction diodes, indicating that the associated diode-type memory cells are set to a permanently-ON state representing the permanent storage of a first binary digit, for example 0. On the other hand, no current will be detected in these memory cells that are set to a permanently-OFF state representing the permanent storage of a second binary digit, for example 1.

In conclusion, it is a distinctive feature of the invention that the bit lines of the ROM device are arranged in an alternate manner on the bottom of a plurality of parallel-spaced trenches and on the top of the solid portions between these trenches. This feature allows for an increased density of the bit lines on the wafer, and thus an increased integration of the diode-type memory cells on a limited wafer surface without having to reduce the feature size of the semiconductor components of the ROM device.

Moreover, the ROM device of the invention can be operated at a low operating voltage while still producing an adequate current that can be sensed. This feature is advantageous over the MOSFET-type of memory cells that will produce a smaller current when the same level of operating voltage is applied thereto.

In addition, the ON/OFF state of each of the memory cells of the ROM device of the invention is dependent on whether a contact window is predefined to form a $P^+$ doped region therein. This feature is also advantageous over the MOSFET-type of memory cells whose ON/OFF states are dependent on the doping concentration of associated diffusion regions, which is a more complex process to perform.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A ROM device including a plurality of diode memory cells, which comprises:

a semiconductor substrate of a first semiconductor formed with a plurality of substantially parallel-spaced trenches oriented in a first direction;

a plurality of substantially parallel-spaced diffusion regions of a second semi-conductor formed in an alternate manner on the bottom of said trenches and on the top of the solid portions between said trenches, said diffusion regions serving as a plurality of bit lines;

a plurality of doped regions of the first semiconductor formed in a selected number of locations on said diffusion regions that are associated with a first group of the memory cells of said ROM device that are set to a permanently-ON state;

an insulating layer formed over those locations on said diffusion regions that are associated with a second group of the memory cells of said ROM device that are set to a permanently-OFF state; and a plurality of substantially parallel-spaced conductive layers serving as a plurality of word lines oriented in a second direction to intercross said bit lines, said word lines coming into electrical contact with all of said doped regions formed in the bit lines associated with the first group of memory cells.

2. The ROM device of claim 1, wherein said first semiconductor type is N while said second semiconductor is P-type.

3. The ROM device of claim 1, wherein said first semiconductor is P-type while said second semiconductor is N-type.

4. The ROM device of claim 1, wherein in each of the first group of memory cells that are set to a permanently-ON state, a diode junction is formed between the associated doped region and diffusion region, said diode junction being electrically connected to the associated word line via a contact window in said insulating layer.

5. The ROM device of claim 1, wherein in each of the second group of memory cells that are set to a permanently-OFF state, no contact window is formed in the associated portion of said insulating layer.

6. The ROM device of claim 5, wherein in each of the second group of memory cells that are set to a permanently-OFF state, no doped region is formed in the associated bit line.

7. The ROM device of claim 1, wherein the first group of memory cells that are set to a permanently-ON state represents the permanent storage of a binary digit of 1.

8. The ROM device of claim 7, wherein the second group of memory cells that are set to a permanently-OFF state represents the permanent storage of a binary digit of 0.

9. The ROM device of claim 1, wherein the first group of memory cells that are set to a permanently-ON state represents the permanent storage of a binary digit of 0.

10. The ROM device of claim 9, wherein the second group of memory cells that are set to a permanently-OFF state represents the permanent storage of a binary digit of 1.

11. The ROM device of claim 1, wherein said insulating layer includes:

a pad oxide layer; and a layer of silicon nitride formed over said pad oxide layer.

* * * * *